(12) United States Patent
Tanaka

(10) Patent No.: US 6,310,425 B1
(45) Date of Patent: Oct. 30, 2001

(54) SURFACE ACOUSTIC WAVE DEVICE

(75) Inventor: Naoki Tanaka, Sakai (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/533,671

(22) Filed: Mar. 23, 2000

(30) Foreign Application Priority Data

Mar. 25, 1999 (JP) .................................................. 11-081625

(51) Int. Cl.$^7$ .................................................. H01L 41/04
(52) U.S. Cl. .................................. 310/313 R; 310/313 A
(58) Field of Search ........................... 310/313 A, 313 R; 333/193

(56) References Cited

U.S. PATENT DOCUMENTS

| | | | |
|---|---|---|---|
| 3,965,444 | * 6/1976 | Willingham et al. | 310/313 A |
| 5,646,468 | * 7/1997 | Nakahata et al. | 310/313 A |
| 5,719,538 | * 2/1998 | Kadota | 333/193 |
| 5,731,748 | * 3/1998 | Tada | 333/193 |
| 5,760,522 | * 6/1998 | Kobayashi et al. | 310/313 A |
| 5,760,524 | * 6/1998 | Higgins, Jr. et al. | 310/313 A |
| 5,998,907 | * 12/1999 | Taguchi et al. | 310/313 R |
| 6,025,636 | * 2/2000 | Nakahata et al. | 257/416 |
| 6,037,699 | * 3/2000 | Kobayashi et al. | 310/313 A |

OTHER PUBLICATIONS

Li et al. Investigation of Surface Leaky Longitudinal Waves on Lithium Niobate Substrates. 1997 IEEE International Frequency Control Symposium. May 28–30, 1997.*

Zaitsev et al. Characteristics of Quasi–Shear–Horizontal (QSH) Acoustic Waves in Thin Piezoelectrc Plates. 1998 IEEE Utrasonics Symposium Oct. 5–8, 1998.*

Lee et al. Thin–Film Lithium Niobate on Diamond–Coated Silicon Substrates for Surface Acoustic Wave Applications. 1999 IEEE Ultrsonics Symposium. Oct. 17–20, 1999.*

Hickernill et al. The Use of Design of Experiments for the Optimization of Deposited Glass on Saw Filters. 1999 Joint Meeting EFTF—IEEE Internationl Frequency Control Symposium. Apr. 13–16, 1999.*

Zaitsev et al. Propagation of QSH (Quasi Shear Horizontal) Acoustic Waves in Piezolectric Plates. IEEE Transactions on Ultrasonics, Ferroelectrics, and Frequency Control, vol. 46, No. 5. Sep. 1999.*

Kuznetsova et al. Investigation of Acoustic Waves in Thin Plates of Lithium Niobate and Lithium Tantalate. IEEE Trans. on Ultrasonics, Ferroelectric, and Frequency Control, vol. 48, No. 1, Jan. 2001.*

* cited by examiner

*Primary Examiner*—Nestor Ramirez
*Assistant Examiner*—Peter Medley
(74) *Attorney, Agent, or Firm*—Armstrong, Westerman, Hattori, McLeland & Naughton, LLP

(57) ABSTRACT

An SAW device including a glass substrate, an LiNbO$_3$ (LN) substrate, and an electrode. When a pitch of the electrode is $\lambda$, a thickness of the LN substrate is H, and K equals to $2\pi/\lambda$, a product of K and H is at least 1.6 and at most 1.8. Accordingly, a SAW device which can advantageously reduced in size and provided with an enhanced temperature characteristic is obtained while ensuring high K$^2$.

2 Claims, 7 Drawing Sheets

SURFACE WAVE OUTPUT AT SAME FREQUENCY

SURFACE ACOUSTIC WAVE DEVICE

BACKGROUND OF THE INVENTION

1. Field of the Invention

The present invention relates to surface acoustic wave (SAW) devices.

2. Description of the Background Art

SAW devices include SAW oscillators, transversal SAW filters and oscillator type SAW filters, which are used for different purposes. In the following, a SAW filter will be described as one type of a SAW device.

FIG. 6 is a perspective view schematically showing a structure of a SAW filter. Referring to FIG. 6, SAW filter 15 basically includes a piezoelectric substrate 12, and a four-terminal structure formed on a surface of piezoelectric substrate 12 and having two pairs of comb-shaped electrodes 13 respectively used for exciting and receiving surface waves. Such electrodes 13 are called interdigital electrodes, and this type of transducer is called an IDT (Interdigital Transducer).

Referring to FIG. 7, generally, when an impulse voltage is applied to comb-shaped electrodes 13 for excitation, strains of opposite phases are caused between adjacent electrodes 13 by a piezoelectric effect, thereby exciting a SAW. The SAW propagates on the surface of piezoelectric substrate 12. The strains caused by the SAW produces electric charges at the surface of piezoelectric substrate 12, which are in turn received as electric signals by comb-shaped electrodes 13 for reception.

Conventionally, the SAW device such as SAW filter 15 has a structure in which electrodes 13 in accordance with the purpose of the device are formed on the surface of piezoelectric substrate 12, as shown in FIG. 8. The characteristic of SAW device 15 depends largely on the characteristic of piezoelectric substrate 12, which is also used according to the purpose of the device. Table 1 shows typical materials used for piezoelectric substrate 12 and characteristics of an SAW propagating on piezoelectric substrate 12.

TABLE 1

Characteristics of Substrate for Typical SAW device

| substrate | Eulerian angles φ, θ, ψ | propagation velocity [m/s] | $K^2$ [%] | TCD [ppm/ °C.] | propagation mode |
|---|---|---|---|---|---|
| quartz | 0°, 132.75°, 0° | 3159 | 0.12 | 0 | Rayleigh |
|  | 0°, 15°, 0° | 3948 | 0.11 | 0 | wave Leaky wave |
| LiTaO₃ | 90°, 90°, 112° | 3328 | 1.1 | 16.5 | Rayleigh |
|  | 0°, 126°, 0° | 4211 | 4.7 | 45.1 | wave Leaky wave |
| LiNbO₃ | 0°, 38°, 0° | 4007 | 5.2 | 71.4 | Rayleigh |
|  | 0°, 154°, 0° | 4731 | 10.9 | 61.3 | wave Leaky wave |

As shown in Table 1, a quartz substrate has a good temperature characteristic (value near zero), but the electro-mechanical coupling factor ($K^2$) is disadvantageously small. Conventionally, a 128° Y-X LN substrate ((0°, 38°, 0) LN in an Eulerian angles representation) has been generally used as an LiNbO₃ (LN) substrate. For the conventional LN substrate, although $K^2$ is sufficiently high, the temperature characteristic such as a temperature coefficient of a delay time (TCD) is disadvantageously high.

Thus, the substrates have their own advantages and deficiencies, so that they are used according to the specific purposes of the device. Recently, with technological developments in the field of display units including televisions and telecommunication apparatuses including portable telephones, SAW devices used therefore are also required to have enhanced properties.

Now, Eulerian angles in the above Table 1 will be described with reference to FIG. 9.

Referring to FIG. 9, the X axis is rotated by an angle φ toward the Y axis about the Z axis, and the axis obtained is defined as the first axis. Then, the Z axis is rotated counterclockwise by an angle θ about the first axis, and the axis obtained is defined as the second axis. A material is cut in accordance with a surface orientation along a plane including the first axis and having the second axis as the normal, and used as a substrate. On the substrate which has been cut in accordance with the above mentioned surface orientation, the first axis is rotated counterclockwise by ψ about the second axis, and newly defined as the third axis. The third axis corresponds to a direction in which the SAW propagates. An axis orthogonal to the third axis on the plane is defined as the fourth axis. Thus, the Eulerian angles (φ, θ, ψ) are defined.

It is commonly believed that the higher $K^2$ a piezoelectric substrate has, the easier the design of a device with a large bandwidth is. However, the LN substrate with high $K^2$ is accompanied by a high TCD, and is not suitable for a device which should have a good temperature characteristic.

A center frequency $f_0$ of an SAW device is determined in accordance with the following equation.

$$f_0 = V/\lambda$$

(V: propagation velocity of the SAW, λ: electrode pitch of IDT (FIG. 6))

Thus, in producing devices having the same center frequency $f_0$, if the LN substrate with relatively high propagation velocity V as compared with that of the quartz substrate or the like is used, electrode pitch λ of IDT increases and the size of SAW device is increased.

SUMMARY OF THE INVENTION

One object of the present invention is to provide a SAW device which has an enhanced temperature characteristic with high $K^2$ and which can advantageously be reduced in size.

After intense study to achieve the above mentioned object, the present inventors have found that high $K^2$ and a good temperature characteristic could be obtained if electrode pitch λ and a thickness H of a piezoelectric substrate are set in a prescribed range.

Accordingly, the SAW device of the present invention is provided with a glass substrate, a piezoelectric substrate including LN formed on the glass substrate, and an electrode formed on the piezoelectric substrate. If an electrode pitch is λ, a thickness of the piezoelectric substrate is H, and K equals to 2π/λ, then a product of K and H (KH) is at least 1.6 and at most 1.8.

An electric field distribution differs from thickness H of piezoelectric substrate and electrode pitch λ. Here, the electric field distribution can be adjusted to concentrate in the piezoelectric substrate as KH is set to at least 1.6 and at most 1.8. Thus, the SAW is efficiently excited, whereby $K^2$ is enhanced.

KH is set to at least 1.6 and at most 1.8 for the following reason. Namely, $K^2$ falls below 5.0% if KH is below 1.6, and TCD and temperature coefficient (TCV) of sound velocity (propagation velocity) sharply increase if KH is above 1.8.

The signs of TCD and TCV of the glass substrate are opposite those of the piezoelectric substrate including LN. As to TCV, for example, the piezoelectric substrate including LN has a plus value, whereas the glass substrate has a minus value. Thus, if these substrates are bonded together, TCDs and TCVs thereof are mutually cancelled and the temperature characteristic is enhanced.

The sound velocity of the glass substrate is lower than that of the piezoelectric substrate including LN. If the glass substrate and the piezoelectric substrate are combined, the piezoelectric substrate is affected by the glass substrate, whereby the sound velocity of the SAW decreases. For example, the thinner the piezoelectric substrate is, the more significant is the effect of the glass substrate and the lower the sound velocity of the SAW. If the thickness of the piezoelectric substrate is gradually increased, the sound velocity of the SAW gradually converges to that of the piezoelectric substrate.

When the glass substrate and the piezoelectric substrate are bonded, the sound velocity of the SAW can be lowered by adjusting the thicknesses of the substrates. Thus, the electrode pitch λ of the IDT is reduced and a smaller SAW device is achieved.

After intense study, the present inventors have found that setting Eulerian angles in a prescribed range could produce high $K^2$ and a good temperature characteristic.

Accordingly, in the above described SAW device, LN is preferably (0°, 40° to 60°, 0° to 5°) in an Eulerian angles representation.

As a result, a substrate of the SAW device is obtained with high $K^2$ which is approximately the same as that of the conventional 128° Y-X LN substrate, as well as a temperature characteristic which is better and a propagation velocity which is lower than those of the 128° Y-X LN substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, an embodiment of the present invention will be described with reference to the drawings.

Figure 1:
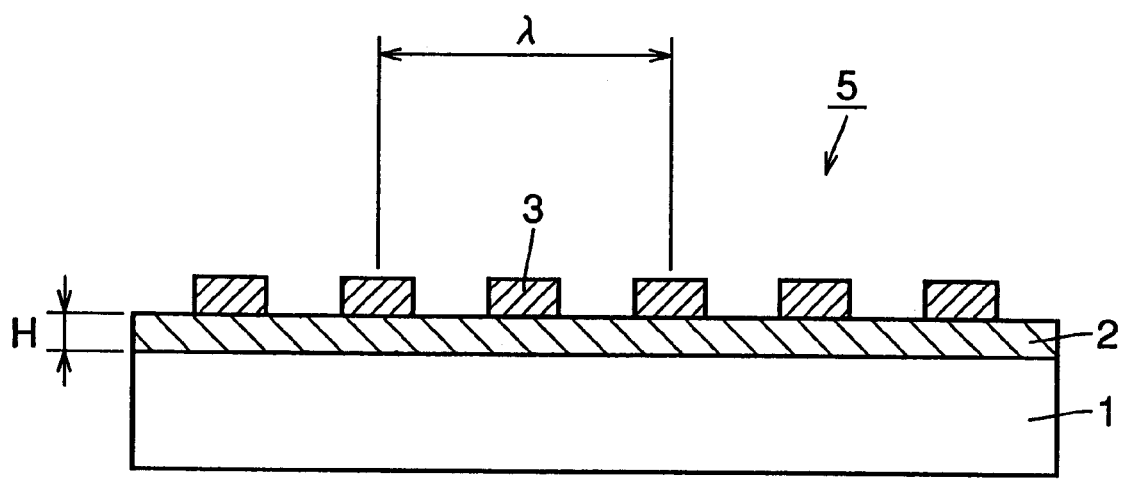
FIG. 1 is a schematic cross sectional view showing a structure of a SAW device according to one embodiment of the present invention.

Referring to FIG. 1, a SAW device 5 includes a glass substrate 1, a piezoelectric substrate 2, and an electrode 3. Piezoelectric substrate 2 is formed on glass substrate 1 and includes LN. Electrode 3 is formed on piezoelectric substrate 2 in accordance with the purpose of the device.

Such a SAW device 5 is obtained by bonding LN substrate 2 on the surface of glass substrate 1 or forming an LN thin film 2 on the surface of glass substrate 1, and then patterning to form electrode 3 on LN substrate (thin film) 2.

For a material of glass substrate 1, for example, quartz glass, aluminosilicate glass, borosilicate glass, soda glass, lead silicate glass or the like is used. The substrate, which is combined with LN substrate 2, is not limited to the glass substrate, and any material having a sound velocity lower than that of LN and having a sign which is opposite to those of TCD and TCV of LN may be used.

In addition, the material of piezoelectric substrate 2 may only or partially include LN. For example, aluminum, although not limited, may be used as the material of electrode 3.

If the thickness of piezoelectric substrate 2 is H, the pitch of electrode 3 is λ, and K equals to 2π/λ, then KH is at least 1.6 and at most 1.8.

LN of piezoelectric substrate 2 is preferably (0°, 40° to 60°,0° to 5°) in an Eulerian angles representation.

In the present embodiment, an electric field distribution varies with the thickness H of LN substrate 2 and electrode pitch λ. Thus, by restricting KH to at least 1.6 and at most 1.8, the electric field distribution can be adjusted to concentrate in LN substrate 2. Accordingly, the SAW is effectively excited and $K^2$ is increased.

Here, KH is restricted to at least 1.6 and at most 1.8 because $K^2$ falls below 5.0% if KH is below 1.6 and TCD and TCV rapidly increase if KH is above 1.8.

Further, the combination of glass substrate 1 and LN substrate 2 enhances TCD and TCV. More specifically, as TCD and TCV of glass substrate 1 have signs opposite to those of LN substrate 2 (in the case of TCV, for example, LN substrate 2 has a plus value, whereas glass substrate 1 has a minus value), the combination of substrates 1 and 2 makes it possible to cancel TCDs and TCVs of the substrates. Therefore, a good temperature characteristic is obtained.

Glass substrate 1 is formed of a material having a sound velocity lower than that of LN substrate 2. The combination of glass substrate 1 and LN substrate 2 permits an influence of glass substrate 1 over LN substrate 2, so that the sound velocity of the SAW is reduced. Thus, electrode pitch λ is reduced and the SAW device per se is reduced in size.

Figure 2:
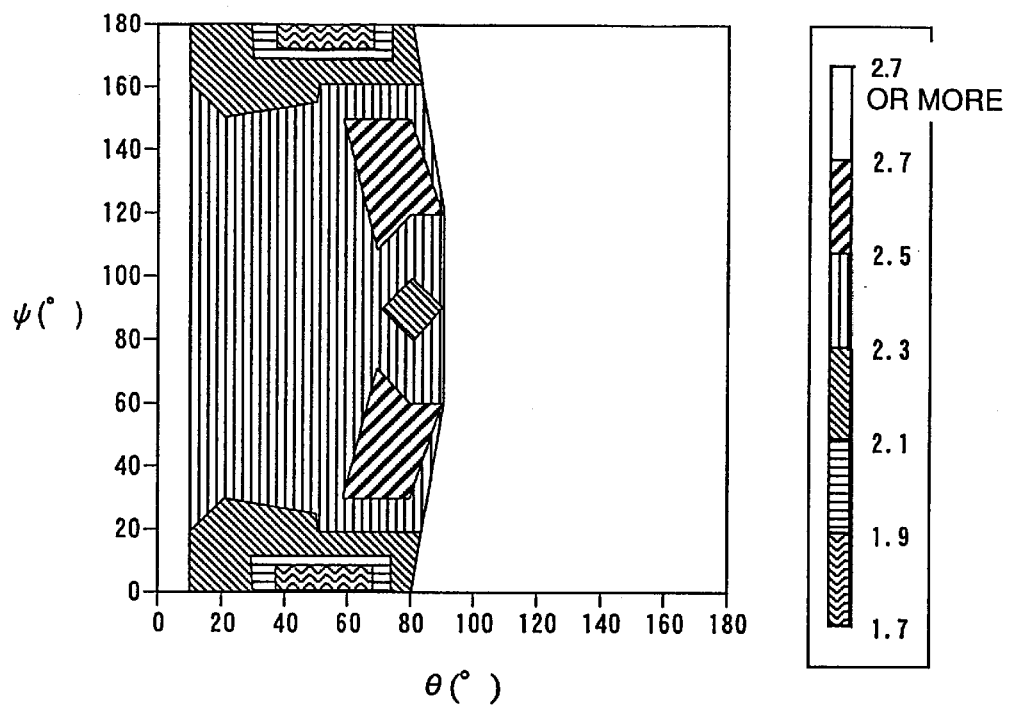
FIG. 2 is a graph shown in conjunction with a value of KH at which $K^2$ of (0°, θ, ψ) LN/glass-structure substrate is a 5.2%.

For an LN/glass-structure substrate having Eulerian angles of (0°, θ, ψ) shown in FIG. 1, a value of KH when $K_2$ is 5.2% as in the case of 128° Y-X LN substrate was calculated. The result is shown in FIG. 2. The range of KH of interest was 0≦KH≦3.0. The orientation range not providing 5.2% with such KH is shown in FIG. 2 with a blank.

Figure 3:
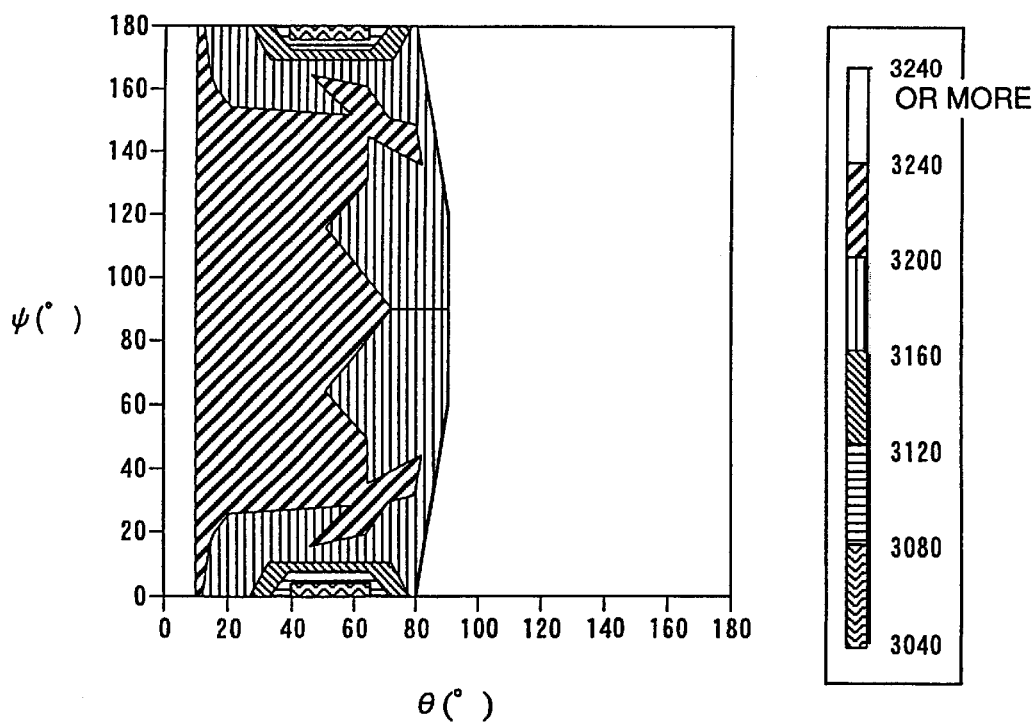
FIG. 3 is a graph shown in conjunction with a propagation velocity of the (0°, θ, ψ) LN/glass-structure substrate a KH shown in FIG. 2.
Figure 4:
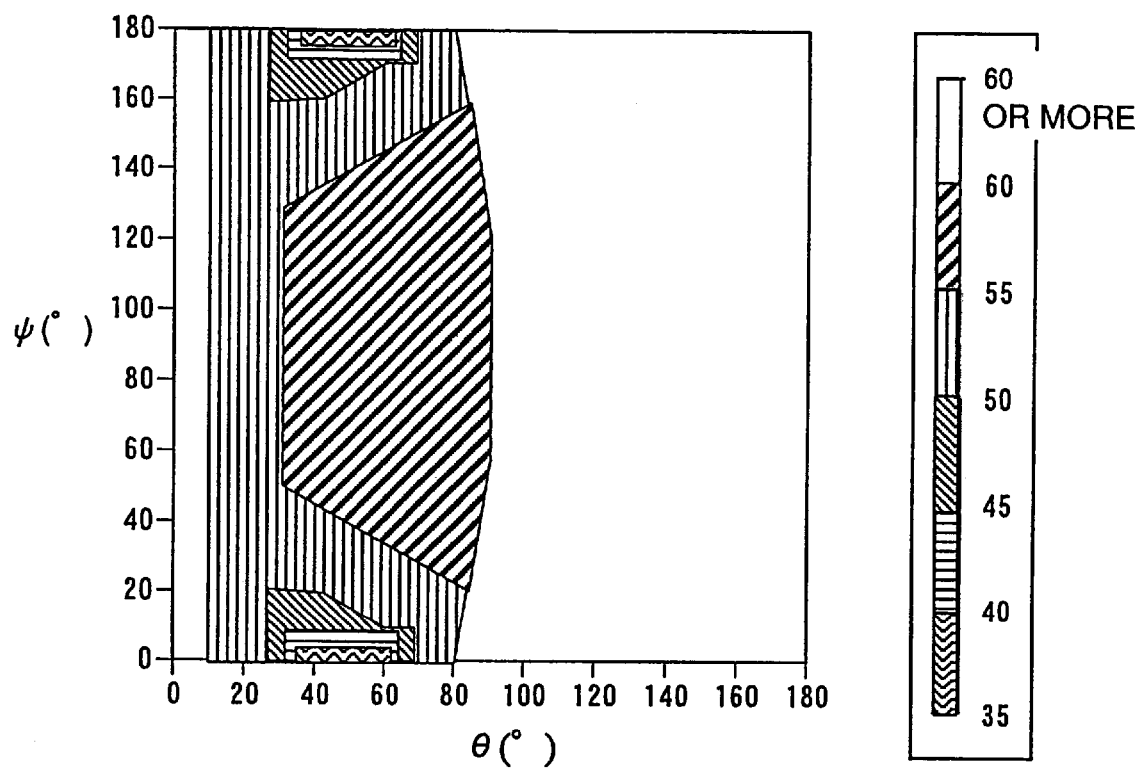
FIG. 4 is a graph showing TDC of the (0°, θ, ψ) LN/glass substrate at KH shown in FIG.2.

Further, results of a propagation velocity and TCD with KH shown in FIG. 2, i.e., KH providing $K^2$ of 5.2% are respectively shown in FIGS. 3 and 4. A material constant of glass generally used for the material of electronic device was used in the calculation. The material constant of glass used for the calculation is shown in the following Table 2.

TABLE 2

Material Constant of Glass Used in Calculation

| | |
|---|---|
| density | 2.76 g/cm$^3$ |
| coefficient of thermal expansion | 46 × 10$^{-7}$° C. |
| dielectric constant | 5.8 |
| Young's modulus | 6.86 × 10$^3$ kg/mm$^2$ |
| Poisson's ratio | 0.28 |

As shown in FIGS. 2 to 4, it was found that Eulerian angles with a good temperature characteristic and a low propagation velocity were obtained over a wide range as compared with the case of 128° Y-X LN substrate. Especially, with LN for (0°, 40° to 60°, 0° to 5°), TCD was about 37 ppm/° C., which was almost half that for 128° Y-X LN substrate. In addition, the propagation velocity was about 3050 m/s, which is lower than that for 128° Y-X LN substrate by about 20%. Then, KH was about 1.7.

Calculation was made for each of the cases where $\phi$ equals to 10°, 20°, and 30° as in the above described case. Orientations better than (0°, 40° to 60°, 0° to 5°), that is, orientations with good temperature characteristic and low-propagation-velocity could not be found.

As described above, it was found that a SAW filter could be manufactured which has a good temperature characteristic and is effectively reduced in size, as compared with the SAW device with the conventional 128° Y-X LN substrate, by using the substrate having LN for the Eulerian angles of (0°, 40° to 60°, 0° to 5°) and, especially, LN where KH equals to 1.7.

If KH is at least 1.6 and at most 1.8, it was also found that a result would be almost the same as that where KH is 1.7.

It is noted that the above mentioned calculations were performed over the ranges of 0°≦$\phi$≦30°, 0°≦$\theta$≦180°, and 0°≦$\psi$≦180°, in view of symmetry of LN crystal property.

Figure 10:
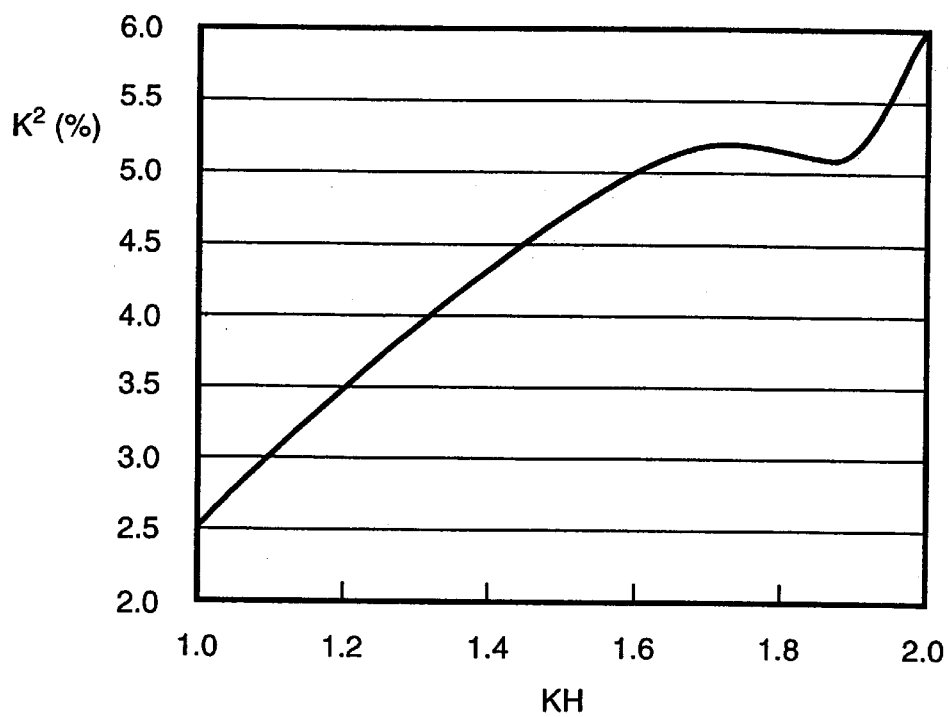
FIG. 10 is a graph showing a relationship between KH and $K^2$.
Figure 11:
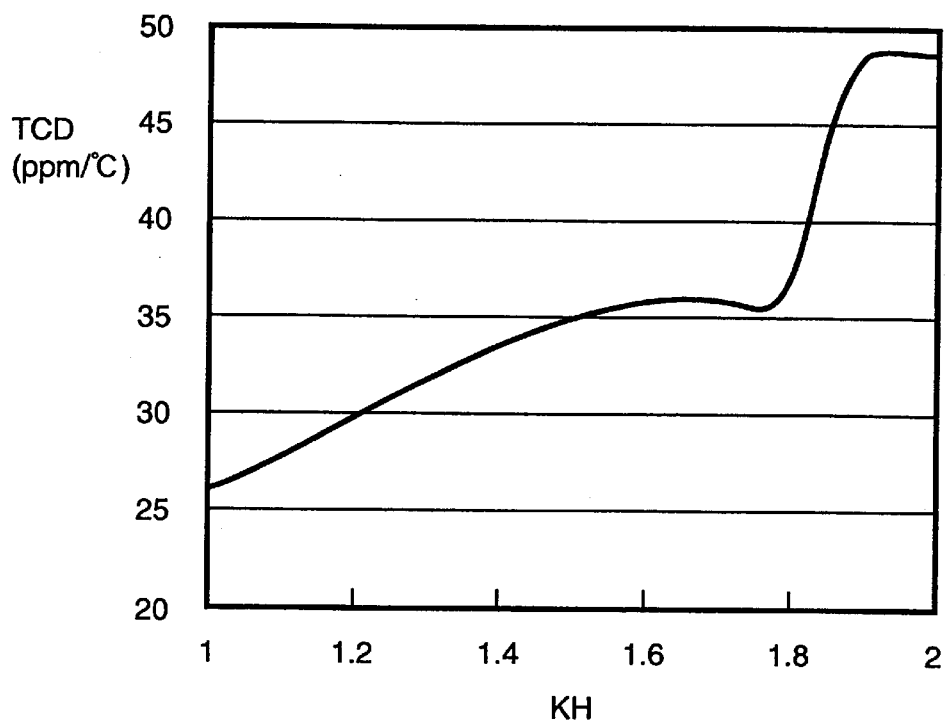
FIG. 11 is a graph showing a relationship between KH and TCD.

Further, relationships between KH and K$^2$ as well as between KH and TCD were examined over the Eulerian angles of (0°, 50°, 0°). The results were shown in FIGS. 10 and 11. As a result, it was found that K$^2$ falls below 5.0% when KH is below 1.6 and TCD rapidly increases when KH exceeds 1.8. It is noted that TCV rapidly increased once KH exceeded 1.8.

Next, an embodiment in which an SAW filter is manufactured with an LN/glass substrate having the above mentioned good characteristic will be described.

Referring to FIG. 1, glass substrate 1 having the material constant shown in Table 2 and (0°, 50°, 0°) LN substrate 2 with a thickness of 23 μm were bonded by a direct bonding technique, and an electrode 3 was formed on the surface of LN substrate 2. Here, the direct bonding technique allows direct bonding of substrates without any adhesion layer interposed. More specifically, hydrophilicity was applied to glass substrate 1 and LN substrate 2, which have been polished and washed, by an ammonia based solution, and then substrates 1 and 2 were bonded together by overlay hydrogen bonding.

In the present embodiment, a thermal treatment was performed after bonding, in order to increase a bonding tightness. An aluminum film of 1000 Å was formed on the substrate of the LN/glass structure by sputtering, and patterning was performed by photolithography for electrodes 3.

Figure 5:
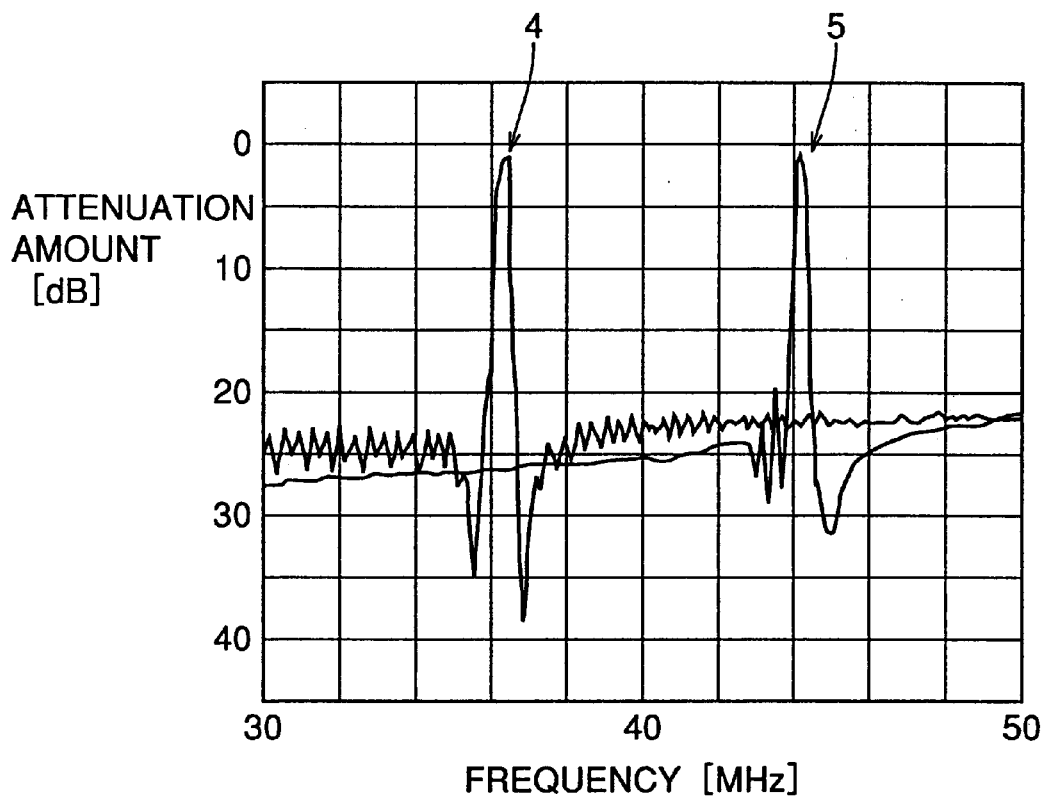
FIG. 5 is graph showing in comparison frequency characteristics of SAW filters respectively using a 128° Y-X LN subrate and LN/glass of the present invention.
Figure 6:
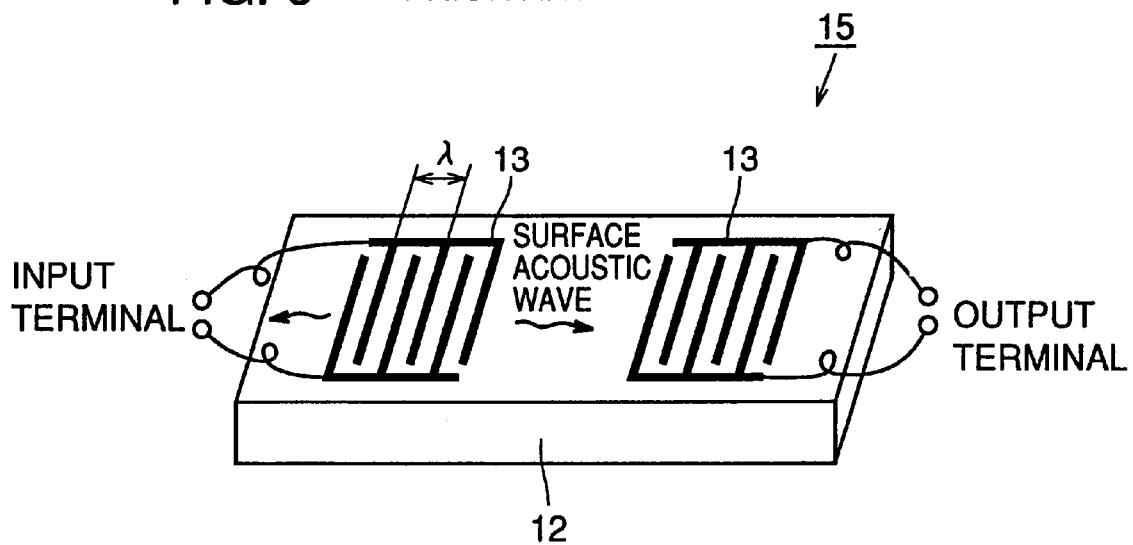
FIG. 6 is a perspective view showing a structure of a general SAW filter.
Figure 7:
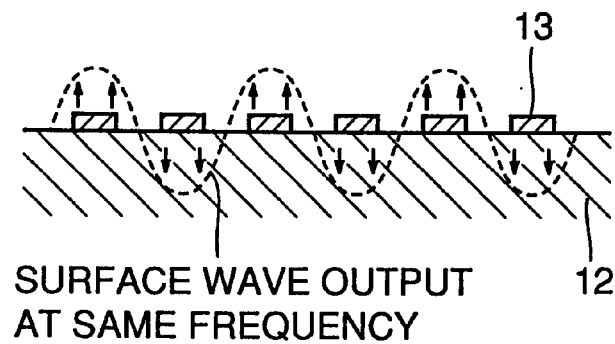
FIG. 7 is a diagram shown in conjunction with an operation of the SAW filter shown in FIG. 6.
Figure 8:
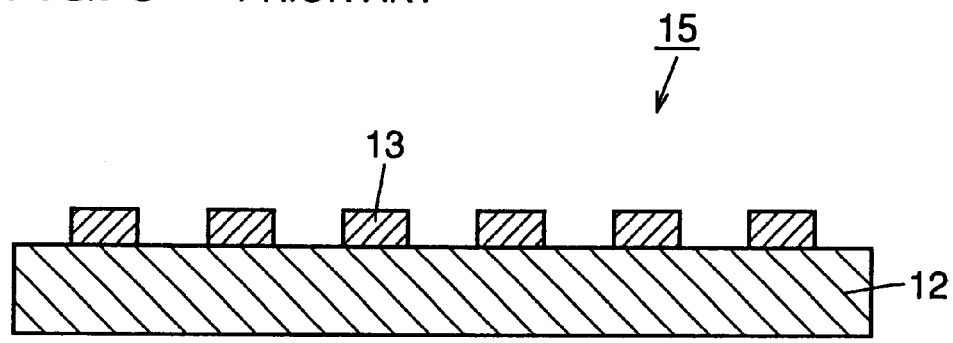
FIG. 8 is a cross sectional view schematically showing a structure of a conventional SAW device.
Figure 9:
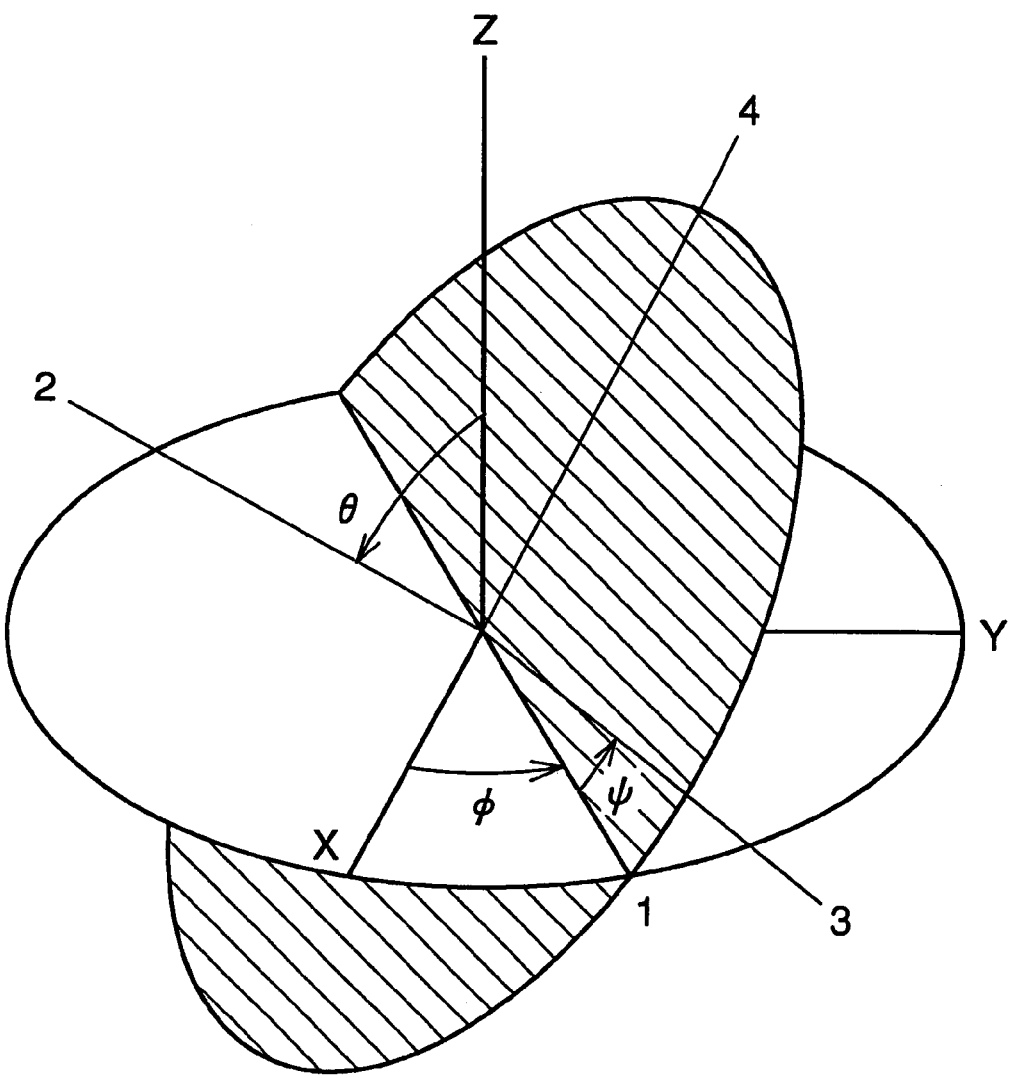
FIG. 9 is a diagram shown in conjunction with Eulerian angles.

Frequency characteristics of SAW filters having electrodes which were respectively formed on the conventional 128° Y-X LN substrate and LN/glass substrate of the present invention with the same parameter were examined. The result is shown in FIG. 5. Here, electrode pitch λ was set to 85 μm such that KH equals to 1.7.

Referring to FIG. 5, comparing a frequency characteristic 4 of the SAW filter using the LN/glass substrate of the present invention and a frequency characteristic 5 of the SAW filter using the conventional 128° Y-X LN substrate, clearly, resonance frequencies thereof considerably differ. This is because the propagation velocity of the SAW filter of the present invention is less than that of the conventional SAW filter. To make the SAW filter of the present invention attain to the same frequency band as for the conventional SAW filter, electrode pitch λ must be reduced. The SAW filter of the present invention can achieve a corresponding reduction in size. As for passband characteristics, there is not a large difference in insertion losses and passband. Thus, the SAW filter of the present invention has K$^2$ which is almost the same as that of the conventional SAW filter.

As described above, in the surface acoustic wave device of the present invention, KH is set to at least 1.6 and at most 1.8, so that the electric field distribution can be adjusted to concentrate in the piezoelectric substrate. Thus, the SAW can efficiently be excited and K$^2$ is increased.

Further, as the glass substrate and the piezoelectric substrate are bonded together, respective TCDs and TCVs are mutually cancelled, whereby the temperature characteristic is enhanced.

Moreover, as the glass substrate and the piezoelectric substrate are bonded together, thicknesses thereof are adjusted to reduce the sound velocity of the surface acoustic wave. Accordingly, electrode pitch λ of an IDT is reduced and a corresponding reduction in size of the SAW device is achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device, comprising:

a glass substrate;

a piezoelectric substrate including LiNbO$_3$ formed on said glass substrate; and an electrode formed on said piezoelectric substrate, wherein a product of K and H is at least 1.6 and at most 1.8 where a pitch of said electrode is λ, a thickness of said piezoelectric substrate is H, and K equals to 2π/λ.

2. The surface acoustic wave device according to claim 1, wherein said LiNbO$_3$ is (0°, 40° to 60°, 0° to 5°) in an Eulerian angles representation.

* * * * *